United States Patent [19]

Chevallier et al.

[11] 4,147,667
[45] Apr. 3, 1979

[54] PHOTOCONDUCTOR FOR GAAS LASER ADDRESSED DEVICES

[75] Inventors: Jacques P. Chevallier, Maurepas, France; Charles R. Guarnieri, San Jose, Calif.; Aare Onton; Harold Wieder, both of Saratoga, Calif.

[73] Assignee: International Business Machines Corporation, Armonk, N.Y.

[21] Appl. No.: 869,194

[22] Filed: Jan. 13, 1978

[51] Int. Cl.² .............................................. H01C 31/00
[52] U.S. Cl. ..................................... 252/501; 252/518
[58] Field of Search ................................. 252/501, 518

[56] References Cited

U.S. PATENT DOCUMENTS

| 3,279,954 | 10/1966 | Cody et al. ..................... 75/134 S X |
| 3,966,470 | 6/1976 | Feltz et al. ..................... 75/134 G X |
| 3,979,271 | 9/1976 | Noreika et al. ................ 75/134 G X |

OTHER PUBLICATIONS

Journal of Non-Crystalline Solids, 13 (1973/74) 55-68, "Photoconductivity and Absorption in Amorphous Si."
Journal of Non-Crystalline Solids, 4 (1970) 272-278, "The Fundamental Absorption of Amorphous Ge, Si and GeSi Alloys."
Journal of Non-Crystalline Solids, 3 (1970), 225-270, "Properties of Glow-Discharge Deposited Amorphous Germanium and Silicon."
"Optical Properties of Amorphous Si-Ge Alloys Prepared by the Glow Discharge Process", A. Onton et al., San Diego Meeting of the American Physical Society, Mar. 21-24, 1977.

Primary Examiner—Benjamin R. Padgett
Assistant Examiner—E. Suzanne Parr
Attorney, Agent, or Firm—Joseph E. Kieninger

[57] ABSTRACT

An improved photoconductor for GaAs laser addressed devices sensitive to illumination at about 1.5 eV is an amorphous material containing silicon, hydrogen and a material taken from the group consisting of Ge, Sn and Pb. A preferred embodiment of this invention is amorphous $Si_xGe_{1-x}H_y$ where x equals 0.78 to 0.93 and y equals 14-20 atomic percent.

6 Claims, 1 Drawing Figure

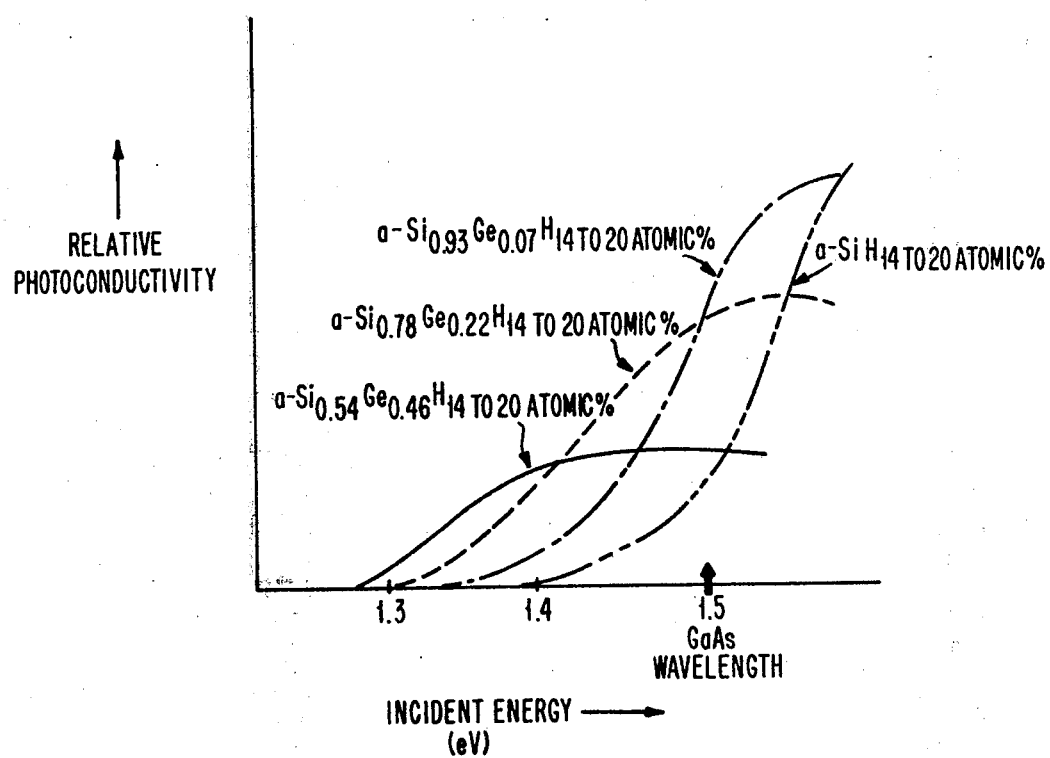

PHOTOCONDUCTOR FOR GAAS LASER ADDRESSED DEVICES

FIELD OF THE INVENTION

This invention relates to photoconductors and more particularly photoconductors sensitive to illumination at about 1.5 eV.

BRIEF DESCRIPTION OF PRIOR ART

Infrared sensitive photoconductors having high dark resistivity and fast response times are of interest for applications involving high speed photoactivated devices. It is particularly useful to have photoconductors which are sensitive to gallium arsenide, GaAs, lasers, which have a peak emitting energy at about 1.5 eV.

The preparation of amorphous silicon and amorphous germanium by the glow discharge method was reported by Chittick in the Journal of Non-crystalline Solids, Vol. 3 (1970) pgs. 255-270. Chittick reported that the amorphous silicon which contained hydrogen incorporated therein as the result of being prepared by the glow discharge process was a very good photoconductor in the spectral range above 2 eV. However, the photoconductivity dropped off significantly at values below 2 eV and was relatively weak at 1.5 eV, the wavelength of the GaAs laser. Chittick also reported that the amorphous germanium prepared by the same method and containing hydrogen therein had no measurable photoconductivity and had a low dark resistivity.

Crystalline Si-Ge alloys have been prepared as reported by Braunstein in Physical Review, Vol. 130, page 869 in 1963. These alloys, however, did not exhibit any significant photoconductivity.

It was reported by Beaglehole in the Journal of Non-Crystalline Solids, Vol. 4, page 272 in 1970 that amorphous Si-Ge alloys that had been prepared by the co-evaporation method did not exhibit any significant photoconductivity. The amorphous Si-Ge alloys prepared by this method did not have any hydrogen incorporated therein as a result of the method by which it was formed.

SUMMARY OF THE INVENTION

It is a primary object of this invention to provide a photoconductor with improved response in the infrared.

It is still another object of this invention to provide a photoconductor being sensitive at the wavelength of the GaAs laser, that is, 1.5 eV.

It is a further object of this invention to provide a photoconductor sensitive at 1.5 eV that has fast response and high dark resistivity.

These and other objects are accomplished by an amorphous $Si_xA_{1-x}H_y$ alloy where A is taken from the group consisting of Ge, Sn and Pb, and where $x=0.50$ to 0.99 and $y=1$ to 50 atomic percent. A preferred embodiment of this invention is amorphous $Si_xGe_{1-x}H_y$, where x ranges from 0.78 to 0.93 and y ranges from 14 to 20 atomic percent. This material is a good photoconductor at 1.5 eV and it has a high dark resistivity of about $10^8$ ohm-cm and a rapid response, i.e., a mobility of $5 \times 10^{-2}$ cm$^2$/Vs.

Other objects of this invention will be apparent from the following detailed description, reference being made to the accompanying drawing wherein various embodiments of the invention are shown.

BRIEF DESCRIPTION OF THE DRAWING

FIG. 1 illustrates the photoconductor in the vicinity of the absorption edge for 3 compositions in accordance with this invention, compared to amorphous silicon containing comparable amounts of hydrogen incorporated therein.

DESCRIPTION OF THE ILLUSTRATIVE EMBODIMENTS

In accordance with this invention, an improved photoconductor for GaAs laser addressed devices which is sensitive to illumination at about 1.5 eV is an amorphous material containing silicon, hydrogen and a material taken from the group consisting of Ge, Sn and Pb. The structure for this amorphous alloy is $Si_xA_{1-x}H_y$ where A is taken from the group consisting of Ge, Sn and Pb, x equals 0.50 to 0.99 and y equals 1 to 50 atomic percent.

A preferred element in the amorphous silicon alloy is germanium, Ge. A preferred concentration of germanium is when x equals 0.78 to 0.93. A preferred concentration of H is when y is 5 to 35 atomic percent. The addition of a compound from the group, for example, germanium, appears to shift the absorption edge of the amorphous silicon further into the infrared region without altering either the response time or the dark resistivity which would be obtained with amorphous silicon, thereby making a sensitivity match to the GaAs wavelength of about 1.5 eV.

The amorphous alloys of this invention may be prepared by the glow discharge process or alternatively in a sputtering system with the appropriate elements in a carrier gas containing hydrogen. Both methods are familiar to those skilled in the art. Preferably, an amorphous alloy such as Si-GeH is prepared by simultaneously introducing silane and germane into the chamber in the glow discharge process.

EXAMPLE NO. 1

A film 1 to 3 microns thick of amorphous $Si_xGe_{1-x}H_y$, where x is 0.93 and y is between 14 and 20 atomic percent, was prepared by the RF glow discharge decomposition of silane and germane gases. The mixed gases were reacted at 310 mTorr pressure, the flow rate was 0.6 Scc/S and a net RF power of 24 watts was employed. The substrate temperature was maintained constant at 250° C. Hydrogen is present in this glow discharge process. The photoconductivity showing the shifting of the absorption edge further into the infrared is shown in FIG. 1 where it is compared with an amorphous silicon alloy having a similar amount of hydrogen incorporated therein.

EXAMPLES 2 and 3

Films containing germanium and having 0.78 silicon and 0.54 silicon, respectively, were prepared by the method described above under Example 1. The photoconductivity of these two materials is set forth in FIG. 1.

As illustrated in FIG. 1, all three alloys, examples 1, 2 and 3, prepared in accordance with this invention, shift the absorption edge further into the infrared. Furthermore, this is accomplished without altering either the resistivity or the response time of the material. These three alloys have a sensitivity at the GaAs wavelength of 1.5 eV which is greater than that for the amorphous silicon material containing hydrogen only.

Although preferred embodiments of this invention have been described, it is understood that numerous variations may be made in accordance with the principles of this invention.

What is claimed is:

1. A photoconductor sensitive to illumination from a GaAs laser at about 1.5 eV comprising amorphous $Si_xA_{1-x}H_y$ where A is selected from the group consisting of Ge, Sn and Pb $x = 0.50$ to $0.99$ $y = 1$ to 50 atomic percent.

2. A photoconductor as described in claim 1 wherein A is Ge.

3. A photoconductor as described in claim 2 wherein $y = 5$ to 35 atomic percent.

4. A photoconductor as described in claim 2 wherein $y = 14$ to 20 atomic percent.

5. A photoconductor as described in claim 2 wherein $x = 0.78$ to $0.93$.

6. A photoconductor as described in claim 5 wherein $y = 14$ to 20 atomic percent.

* * * * *